United States Patent [19]

Watrous, Jr. et al.

[11] 4,005,455
[45] Jan. 25, 1977

[54] CORROSIVE RESISTANT SEMICONDUCTOR INTERCONNECT PAD

[75] Inventors: Willis George Watrous, Jr., Mountain View; Robert T. Jenkins, Byron, both of Calif.

[73] Assignee: Intel Corporation, Santa Clara, Calif.

[22] Filed: Aug. 21, 1974

[21] Appl. No.: 499,184

[52] U.S. Cl. .................................. 357/71; 357/54; 357/59; 357/72

[51] Int. Cl.² ................. H01L 29/34; H01L 29/04; H01L 23/48; H01L 23/28

[58] Field of Search ............... 357/71, 72, 59, 54

[56] References Cited
UNITED STATES PATENTS

| | | |
|---|---|---|
| 3,760,202 | 9/1973 | Kosonocky .................... 357/59 |
| 3,761,327 | 9/1973 | Harlow et al. ................. 357/59 |
| 3,881,971 | 5/1975 | Greer et al. ................... 357/71 |

*Primary Examiner*—Edward J. Wojciechowicz
*Attorney, Agent, or Firm*—Spensley, Horn & Lubitz

[57] ABSTRACT

An interconnect pad for electrical coupling between a semiconductor integrated circuit and external leads or the like which includes a secondary conductive path in the event of degradation of the interconnect pad. Metallic contact and conductive elements in the integrated circuit are separated from, and otherwise protected from, deliquescent chemical radicals such as $P_2O_5$ contained in underlying structure of the integrated circuit by a layer of silicon.

9 Claims, 3 Drawing Figures

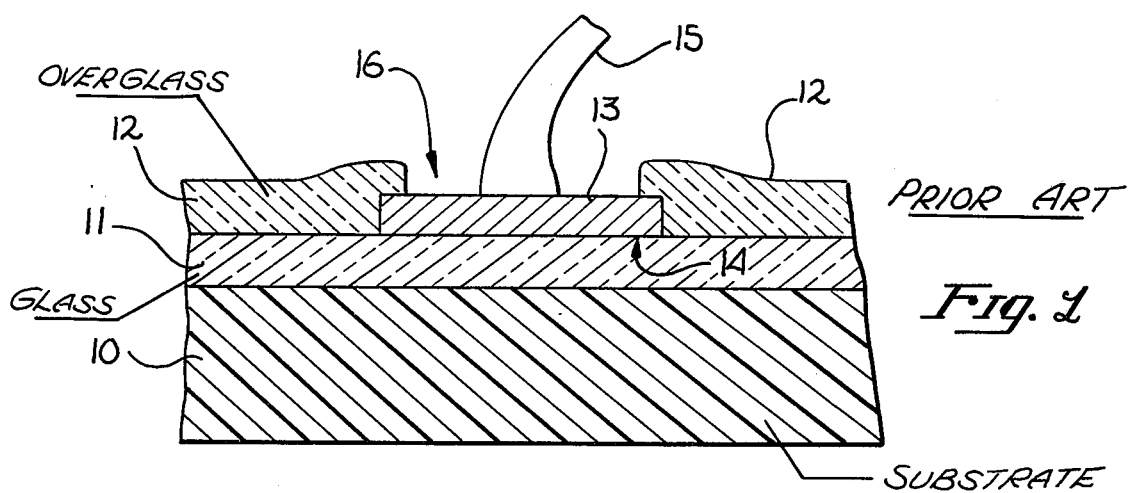
*Fig. 1* — PRIOR ART
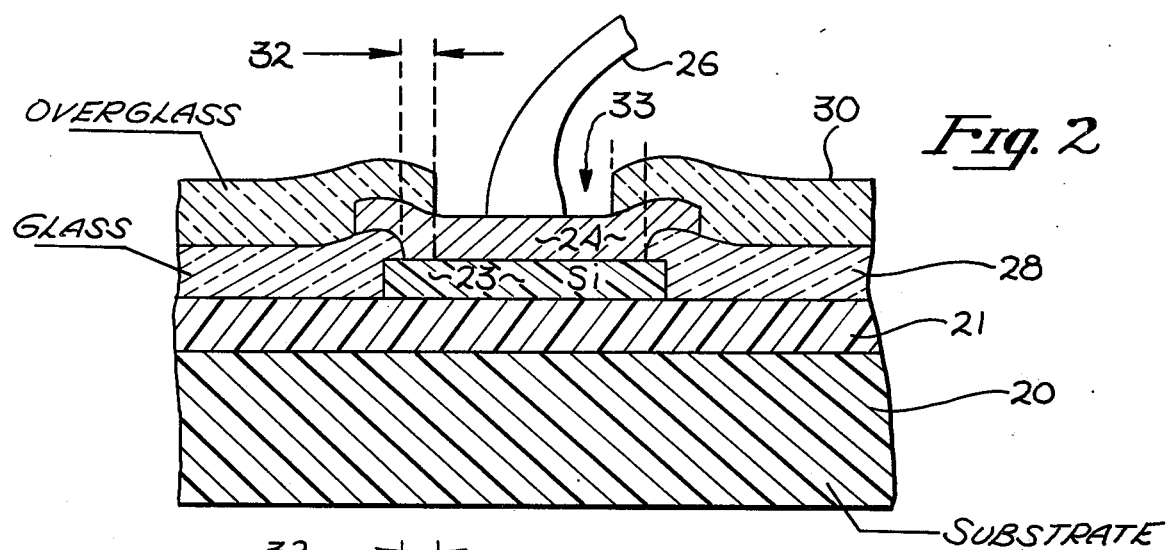
*Fig. 2*
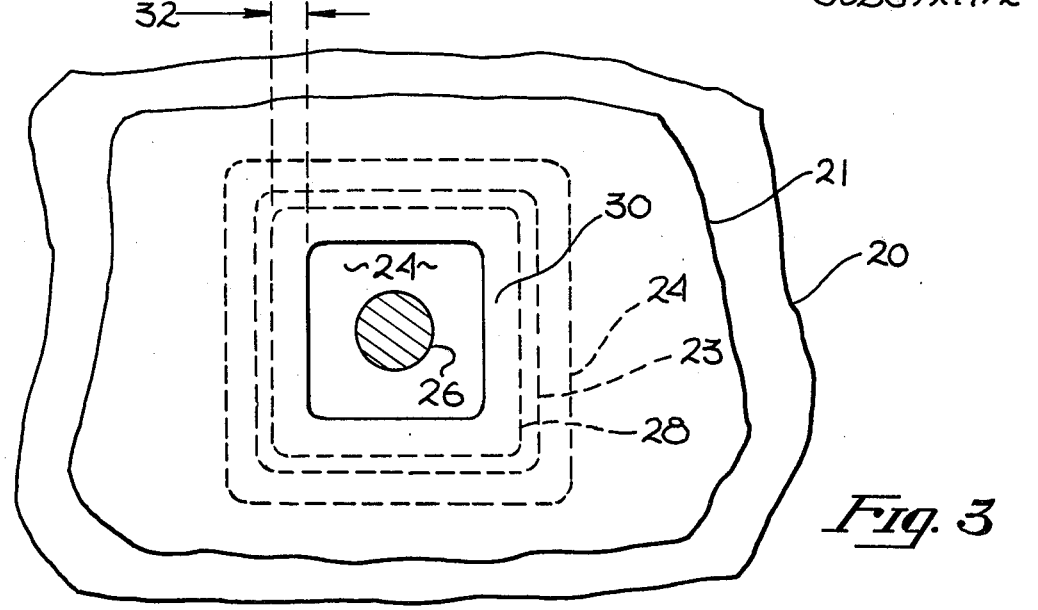
*Fig. 3*

CORROSIVE RESISTANT SEMICONDUCTOR INTERCONNECT PAD

BACKGROUND OF THE INVENTION

1. Field of the Invention

The present invention relates to interconnect pads on semiconductor integrated circuits.

2. Description of the Prior Art

In the prior art multiple layered interconnect pads have been used or more specifically, one or more metallic layers disposed on a semiconductor layer have been used in order to obtain electrical contact to an adjoining semiconductor substrate or other regions. The prior art employed a metallic layer to provide a contact surface compatible with subsequent layers, or wire leads, to make external electrical connection. In the prior art this metallic layer has included one or more metallic elements in one layer or one or more metallic layers. Also small amounts of semiconductor material have been deposited with one or more layers of metal to allow saturation of the metal by the semiconductor material, for example, to prevent "spiking" through an underlying diffused region (see U.S. Pat. No. 3,740,835).

None of the prior art interconnect pads which include metallic layers in combination with semiconductor layers have been addressed to the problem of degradation to exposed metal during the lifetime of the device. More particularly, degradation of interconnect pads may occur during the lifetime of the device by the action of two corrosive agents. The first corrosive source includes degrading agents contained within the semiconductor integrated circuit itself. In the case where a contact is positioned directly on passivating layer of the semiconductor integrated circuit, impurities within the passivating layer may combine with water vapor from the environment to form corrosive agents which degrade the electrical performance of the interconnect pad. This may occur even with sealed devices because of imperfections in the seal. For example, phosphorus oxide, contained within a passivating glass layer may act as a deliquescent agent with the ambient water vapor to form phosphoric acid at the interface of the metallic pad and the glass layer. This acid corrodes the metallic pad resulting in electrical and mechanical degradation. A second source (or sources) of corrosive agents are those which are exterior to the semiconductor device. Water vapor, acidic vapors, oxygen and other oxidizing agents may attack the upper exposed surfaces of the metallic pad in an unsealed device or in an imperfectly sealed device. Such agents may destroy the electrical performance of the interconnect pad.

The present invention provides a semiconductor barrier between the metallic pad and the underlying passivating layers such that penetration of extrinsic or intrinsic corrosive agents are excluded from the lower surfaces of the metallic pad. Moreover, the present invention provides a second conductive path whereby electrical coupling between the exterior leads and the semiconductor substrate is preserved even though portions of the metallic interconnect pad may be degraded.

SUMMARY OF THE INVENTION

A corrosion resistant semiconductor interconnect pad for electrically coupling a semiconductor integrated circuit with an external lead or the like is described. Unlike prior art interconnect pads where the metallic layer is deployed above the glass layer, the presently disclosed contact is deployed above a semiconductor layer which is fabricated on an underlying oxide layer. The metallic pad, and other interconnections, are fabricated above this semiconductor layer and an overlying protective material, such as an overglass, is then disposed above the aluminum except for the exposed area of the pad. Thus, all contact between the metallic layer and the glass layer such as a layer containing phosphorus oxide is eliminated in all unsealed regions. The pad and semiconductor layer are fabricated such that a corrosion resistant border protected on its upper surface by the overglass and situated on the protective semiconductor layer exists around the exposed regions of the interconnect pad. This provides an additional advantage in that even if the exposed metallic portions of the pad corrode, a conductive path still exists which includes in part the underlying semiconductor layer.

It is an object of the present invention to provide interconnect pads and interconnecting conductive paths which are resistant to corrosive agents contained within underlying layers in a semiconductor device or substrate.

It is still another object of the present invention to provide an interconnect pad for connecting a device with external leads which provides a secondary conductive path in the event the interconnect pad is substantially degraded, particularly by external corrosive agents.

BRIEF DESCRIPTION OF THE DRAWINGS

FIG. 1 is a cross sectional view of a substrate showing a typical prior art interconnect pad.

FIG. 2 is a cross sectional view of a portion of substrate again illustrating an interconnect pad but one fabricated in accordance with the present invention.

FIG. 3 is a partially cutaway plan view of the portion of the substrate and pad illustrated in FIG. 2.

DETAILED DESCRIPTION OF THE INVENTION

Referring first to FIG. 1, the construction of a typical interconnect pad as utilized in the prior art is illustrated which includes a substrate 10. This substrate may include a plurality of devices such as field effect transistors and the like which are not illustrated in order not to obscure the invention in unnecessary detail. After the semiconductor device has been fabricated on or within the substrate 10, often some protective layer, such as glass, is disposed above the substrate. This is illustrated as glass layer 11 and may be by way of example a glass which includes phosphorus oxide ($P_2O_5$) impurities. After the glass layer has been fabricated on the substrate the conductive paths which generally include interconnect pads utilized for providing surfaces to which external leads may be attached, are fabricated. Often aluminum is utilized and a typical pad 13 is illustrated in FIG. 1. Note that in FIG. 1 and for that matter in the remaining figures in this application, the connection between the pads, such as the aluminum pad 13, and the devices and regions disposed in the underlying substrate 10 is not illustrated. Typically, if contact is to be made to a region within the substrate, the glass 11 is etched and conductive material, such as aluminum, physically and electrically contacts the region. This etching, and the fabrication of the conductive paths may be done in accordance with well known semiconductor technology. After the interconnect pad 13 and other conductors have been fabricated, an overglass or other protective layer, such as overglass 12, is disposed above the substrate and then etched to expose the pads such as pad 13. Then external leads, such as a lead 15, may be bonded to the pad 13 in order that external electrical contact may be made with the pad 13, and hence with underlying regions within the substrate 10.

As previously explained, impurities within the glass layer 11 which are in contact with the conductive paths and pads (for example, at surface 14 of FIG. 1) can cause corrosion. Also, while the overglass 12 protects much of the uppermost surface of the pads, area 16 of the upper surface of pad 13 is not covered by the overglass and is susceptible to corrosion by external corrosive agents.

Now referring to FIGS. 2 and 3, a presently preferred embodiment of the present invention will be discussed which is oriented towards MOS technology, although the invention has applications to other semiconductor technology. In FIG. 2, a substrate 20 is illustrated, this substrate may be, for the presently preferred embodiment, an n-type or p-type semiconductor material, such as silicon. While not illustrated, it is assumed that the substrate 20 includes a plurality of semiconductor devices, such as field effect transistors, floating gate memory devices, or the like. Generally, a field oxide is disposed above the substrate, such as the silicon dioxide layer 21 illustrated in FIG. 2.

Disposed beneath the interconnect pads, such as pad 24 of FIG. 2, is a layer of semiconductor material, such as silicon layer 23. In the presently preferred embodiment, where silicon gate technology is employed, the silicon layer 23 is fabricated along with the silicon gates and the layer 23 is doped, with the gates and the source and drain regions in the substrate. For more detailed information concerning the fabrication of silicon gate field effect transistors, see IEEE Spectrum, October 1969, pages 21-35. A protective glass layer 28 is disposed above the entire substrate after the formation (and etching) of the layer 23. This glass, for the presently preferred embodiment includes phosphorus oxide impurities. Note that the glass is disposed over the silicon and over the silicon dioxide layer 21.

Following the formation of the glass 28, this glass is etched utilizing known photofabrication techniques in order to define the contact area to the silicon layer 23 underlying the interconnect pad and to define the conductive paths between the metallic interconnect layer and the underlying semiconductor integrated circuit. The metallic conductive paths, including the pads, are next formed on the substrate, again utilizing standard known processes. In the presently preferred embodiment aluminum is utilized. The silicon layer 23 should be sufficiently thick to assure that during subsequent fabrication steps the silicon will not entirely dissolve within the aluminum.

Following the etching of the aluminum an overglass 30 is disposed above the entire upper surface of the substrate which includes the conductive paths and the glass 28. This overglass 30 is etched to expose the pads such as pad 24. The exposed portion of the pad 24 includes a contact area for receiving a lead or the like.

It is important to note that the silicon layer 23 and the aluminum pad 24 are disposed beneath the overglass 30 such that a corrosion resistant border of aluminum and silicon is buried beneath the overglass 30. That is, the border of aluminum on silicon is disposed between the overglass 30 and dioxide 21. The width of this border is shown by dimension 32 in FIGS. 2 and 3. While in the presently preferred embodiment the border completely surrounds the exposed portion of the pad 24, a "C" shaped, or other shaped partial border may be used.

In the last step of the fabrication of the device a lead, such as lead 26, may be bonded to the aluminum pad 24 by any one of numerous known techniques.

Referring again to FIGS. 2 and 3, note that unlike the prior art illustrated in FIG. 1 where the aluminum pad 13 of FIG. 1 is in contact with the glass 11, the aluminum pad 24 is not in any substantial contact with glass layer 28. Thus, the corrosive elements which may be contained within the glass 28 will not substantially effect or corrode the aluminum.

In FIG. 2 a section 33 of the upper surface of the pad 24 is exposed to possible external corrosive agents (this section corresponding to section 16 of FIG. 1). However, assume that corrosion does occur at this "window" and that the aluminum pad 24 is substantially degragated in this section, electrical contact with still remain with the lead 26 through the aluminum disposed directly beneath the lead 26 and the silicon layer 23. Note that under the border shown by dimension 32, the silicon layer 23 is in contact with a portion of the aluminum pad 24, this portion of the aluminum pad 24 will remain protected because of the overglass 30. The entire contact pad may be fabricated with little change to existing fabrication steps.

Thus, a new and novel interconnect pad has been disclosed that may be fabricated with slight change to existing MOS fabrication steps.

We claim:
1. In a semiconductor device having a substrate which includes at least a first insulative layer disposed thereon, a contact pad for providing electrical coupling between external leads, circuit interconnections and diffused regions contained within said substrate comprising:
 a semiconductor layer overlying at least a portion of said first insulative layer;
 a second insulative layer overlying said first insulative layer and contiguous with said semiconductor layer, wherein said second insulative layer may contain corrosive agents;
 a conductive layer overlying at least said semiconductor layer but having minimal contact with said second insulative layer;
 a third insulative layer overlying at least said second insulative layer and a portion of said conductive layer, said conductive layer being in substantial contact only with said third insulative layer and said semiconductor layer; and
 a lead member disposed on a central portion of said conductive layer so that said lead member is electrically coupled to said semiconductor layer even though electrical parameters of exposed portions of said conductive layer are substantially degraded; thereby preventing corrosion due to impurities contained within said second insulative layer.

2. The interconnect pad defined in claim 1 wherein said semiconductor layer comprises silicon and wherein said conductive layer comprises aluminum.

3. The interconnect pad defined in claim 2 wherein said semiconductor layer is doped.

4. The interconnect pad defined in claim 3 wherein said first insulative layer comprises silicon dioxide.

5. The interconnect pad defined in claim 4 wherein said second insulative layer comprises a glass layer which includes phosphorus oxide.

6. The contact pad defined in claim 1 wherein generally annular shaped abutting portions of said semiconductor layer and said conductive layer are disposed between said third insulative layer and said first insulative layer.

7. A contact pad in an integrated circuit substrate including at least a first insulative layer disposed thereon, said contact pad disposed so as to be protected from corrosive agents external and internal to said integrated circuit, substrate said contact pad comprising:
a semiconductor layer electrically coupled to said integrated circuit substrate and disposed on said first insulative layer;
a conductive layer disposed on said semiconductor layer;
a second insulative layer disposed on at least a part of the perimeter of said conductive layer, said perimeter of said conductive layer being defined as the perimetric portion of said conductive layer, at least part of said perimetric portion of said conductive layer overlying and contiguous with said semiconductor layer; and
a lead member disposed on central portion of said conductive layer so that said lead member is electrically coupled to said perimetric portion of said conductive layer through said semiconductor layer even though exposed portions of said conductive layer between said perimetric and central portions of said conductive layer be substantially degraded.

8. The contact pad of claim 7 wherein said second insulative layer is substantially free of corrosive agents.

9. The contact pad of claim 8 wherein said second insulative layer is substantially free of acid forming impurities.

* * * * *